United States Patent
Song et al.

(10) Patent No.: US 10,032,845 B2
(45) Date of Patent: Jul. 24, 2018

(54) DISPLAY APPARATUS

(71) Applicant: SAMSUNG DISPLAY CO., LTD., Yongin-si, Gyeonggi-do (KR)

(72) Inventors: Hagyeong Song, Yongin-si (KR); Deukjong Kim, Yongin-si (KR); Sangki Kim, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/297,198

(22) Filed: Oct. 19, 2016

(65) Prior Publication Data
US 2017/0294500 A1    Oct. 12, 2017

(30) Foreign Application Priority Data
Apr. 7, 2016  (KR) .......................... 10-2016-0042801

(51) Int. Cl.
*H01L 27/32*    (2006.01)

(52) U.S. Cl.
CPC ...... *H01L 27/3276* (2013.01); *H01L 27/3248* (2013.01); *H01L 27/3262* (2013.01)

(58) Field of Classification Search
CPC . H01L 27/32; H01L 27/3276; H01L 27/3248; H01L 27/3262
See application file for complete search history.

(56) References Cited

U.S. PATENT DOCUMENTS

| 2005/0110023 | A1* | 5/2005 | Lee | ...................... H01L 27/3276 257/72 |
| 2008/0129933 | A1* | 6/2008 | Nishida | ............. G02F 1/133502 349/96 |
| 2009/0068833 | A1 | 3/2009 | Choi | |
| 2015/0137097 | A1* | 5/2015 | Choi | ................... H01L 27/3258 257/40 |

FOREIGN PATENT DOCUMENTS

| KR | 1999-0049196 A | 7/1999 |
| KR | 10-2006-0135432 A | 12/2006 |
| KR | 10-2009-0025778 A | 3/2009 |
| KR | 10-2014-0081408 A | 7/2014 |

* cited by examiner

*Primary Examiner* — Phuc Dang
(74) *Attorney, Agent, or Firm* — Lee & Morse, P.C.

(57) ABSTRACT

A display apparatus including a first conductive layer; a first insulating layer including a first opening exposing a first upper surface of the first conductive layer and covering at least a part of an upper edge of the first conductive layer, wherein the first upper surface of the first conductive layer includes a center portion of an upper surface of the first conductive layer; a second conductive layer on a part of the first upper surface of the first conductive layer and on the first insulating layer; and a second insulating layer including a second opening exposing a second upper surface of the second conductive layer and covering a part of an upper edge of the second conductive layer, wherein the second upper surface of the second conductive layer includes a center portion of the upper surface of the second conductive layer and the second opening has an area that is less than that of the first opening.

20 Claims, 9 Drawing Sheets

DISPLAY APPARATUS

CROSS-REFERENCE TO RELATED APPLICATION

Korean Patent Application No. 10-2016-0042801, filed on Apr. 7, 2016, in the Korean Intellectual Property Office, and entitled: "Display Apparatus," is incorporated by reference herein in its entirety.

BACKGROUND

1. Field

Embodiments relate to a display apparatus.

2. Description of the Related Art

In general, a display apparatus may include a plurality of display devices on a display area. In addition, wires for transferring electric signals that are applied to the display area may be provided on a periphery of the display area.

SUMMARY

The embodiments may be realized by providing a display apparatus including a substrate that includes a display area and a peripheral area, the peripheral area being outside of the display area; a first conductive layer in the peripheral area; a first insulating layer that includes a first opening exposing a first upper surface of the first conductive layer and covering at least a part of an upper edge of the first conductive layer, wherein the first upper surface of the first conductive layer includes at least a center portion of an upper surface of the first conductive layer; a second conductive layer on at least a part of the first upper surface of the first conductive layer and on the first insulating layer; and a second insulating layer that includes a second opening exposing a second upper surface of the second conductive layer and covering at least a part of an upper edge of the second conductive layer, wherein the second upper surface of the second conductive layer includes at least a center portion of the upper surface of the second conductive layer and the second opening has an area that is less than an area of the first opening.

The upper surface of the second conductive layer may include a flat portion at the center portion thereof, and the second insulating layer may cover the upper surface of the second conductive layer except at least a part of the flat portion.

The upper surface of the second conductive layer may have a curved surface in a part thereof, and the second insulating layer may cover the curved surface in the upper surface of the second conductive layer.

The display apparatus may further include a thin film transistor in the display area, the thin film transistor including a gate electrode, a source electrode, and a drain electrode, and wherein the first conductive layer includes a material that is the same as a material of the gate electrode, and the second conductive layer includes a material that is the same as a material of the source electrode and the drain electrode.

The first insulating layer may include a material that is the same as a material of an interlayer insulating layer that is between the source and drain electrodes and the gate electrode, and the second insulating layer may include a material that is the same as a material of a protective layer covering the source electrode and the drain electrode.

The first insulating layer may be integral with the interlayer insulating layer, and the second insulating layer may be integral with the protective layer.

The display apparatus may further include a third conductive layer on the second upper surface of the second conductive layer and the second insulating layer.

The display apparatus may further include a thin film transistor in the display area, the thin film transistor including a gate electrode, a source electrode, and a drain electrode; and a pixel electrode electrically connected to one of the source electrode and the drain electrode, wherein the first conductive layer includes a material that is the same as a material of the gate electrode, the second conductive layer includes a material that is the same as a material of the source electrode and the drain electrode, and the third conductive layer includes a material that is the same as a material of the pixel electrode.

The first insulating layer may include a material that is the same as a material of an interlayer insulating layer between the source and drain electrodes and the gate electrode, and the second insulating layer may include a material that is the same as a material of a protective layer covering the source electrode and the drain electrode.

The first insulating layer may be integral with the interlayer insulating layer, and the second insulating layer may be integral with the protective layer.

The display apparatus may further include an opposite electrode that is provided integrally throughout the display area and extending to a part of the peripheral area, wherein the opposite electrode electrically contacts the third conductive layer.

The display apparatus may further include an opposite electrode that is provided integrally throughout the display area and extending to a part of the peripheral area, wherein the opposite electrode is electrically connected to the second conductive layer.

The first conductive layer may have an island shape.

The embodiments may be realized by providing a display apparatus including a substrate that includes a display area and a peripheral area, the display area including pixels and the peripheral area being outside of the display area; and an electrode power supply line electrically connected to the pixels of the display area, wherein the electrode power supply line includes a connecting conductive layer, and a main conductive layer connected by the connecting conductive layer, wherein the connecting conductive layer has a connection side that is connected to the main conductive layer and a substrate facing side that is opposite to the connection side and that faces the substrate, wherein a first insulating layer overlies an outer edge of the connection side of the connecting conductive layer and includes a first opening that is open on a central portion of the connection side of the connecting conductive layer, wherein the main conductive layer contacts the connection side of the connecting conductive layer at the central portion of the connection side of the connecting conductive layer, and wherein a second insulating layer overlies an outer edge of an outwardly facing surface of the main conductive layer and includes a second opening that is open on a central portion of the outwardly facing surface of the main conductive layer, and wherein the second opening has an area that is smaller than an area of the first opening.

The central portion of the outwardly facing surface of the main conductive layer may include a flat portion, and the second insulating layer may cover portions of the outwardly facing surface of the main conductive layer that surround the flat portion.

The outwardly facing surface of the main conductive layer may have a curved surface in a part thereof, and the second insulating layer may cover the curved surface of the outwardly facing surface of the main conductive layer.

The connecting conductive layer may have an island shape.

The display apparatus may further include a third conductive layer on the outwardly facing surface of the main conductive layer and the second insulating layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
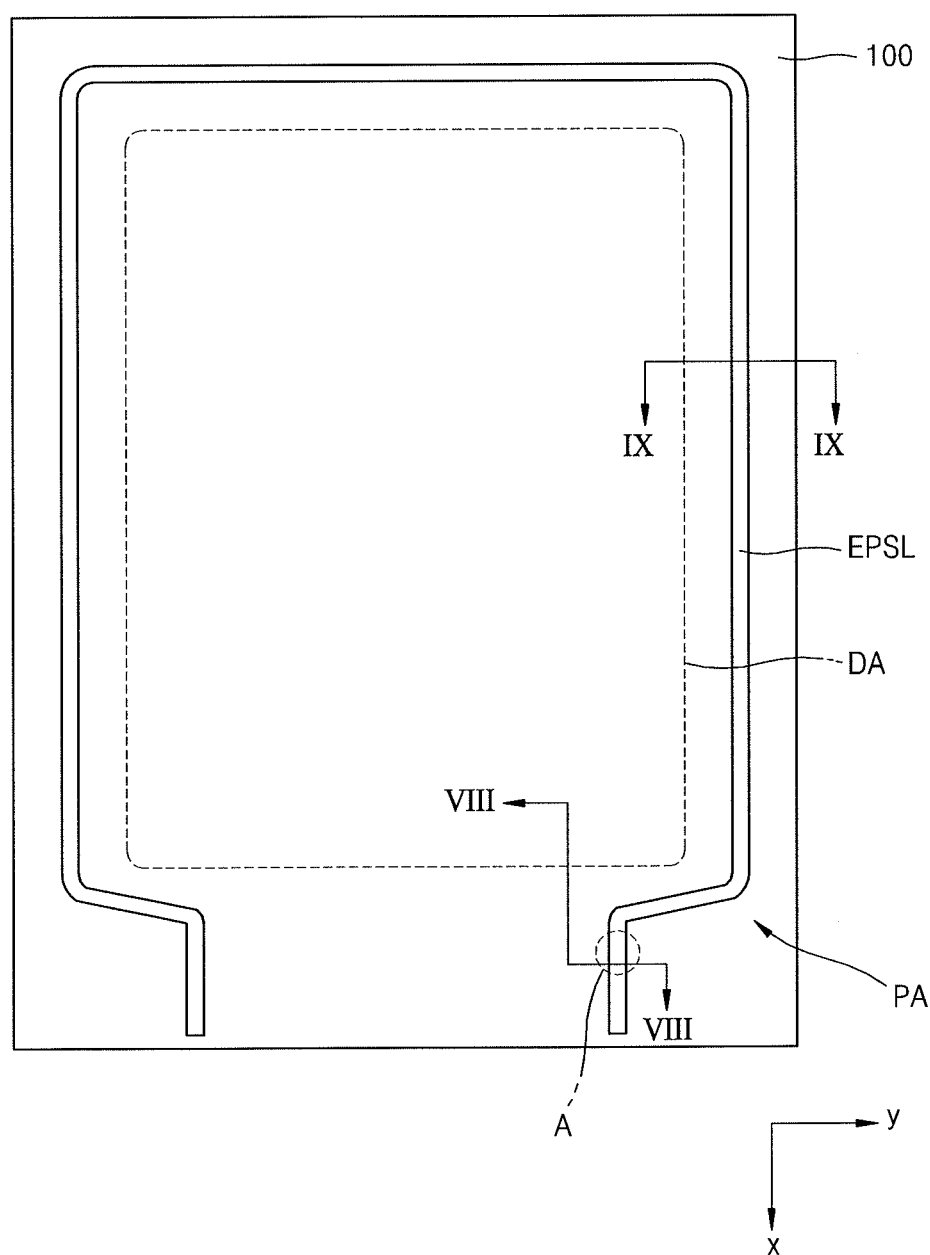
FIG. 1 illustrates a schematic plan view of a part of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening elements may also be present. Further, it will be understood that when an element is referred to as being "under" another element, it can be directly under, and one or more intervening elements may also be present. In addition, it will also be understood that when an element is referred to as being "between" two elements, it can be the only element between the two elements, or one or more intervening elements may also be present. Like reference numerals refer to like elements throughout.

As used herein, the term "and/or" and "or" includes any and all combinations of one or more of the associated listed items. Expressions such as "at least one of," when preceding a list of elements, modify the entire list of elements and do not modify the individual elements of the list.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 illustrates a schematic plan view of a part of a display apparatus according to an embodiment. As shown in FIG. 1, the display apparatus may include, e.g., a substrate 100 that includes a display area DA and a peripheral area PA (on or at an outer portion of the display area DA). Display devices such as an organic light-emitting device may be arranged over the display area DA of the substrate 100, and thin film transistors electrically connected to the display devices may also be arranged over the display area DA. Configurations of the display area DA will be described below.

The substrate 100 may include various materials having flexible or bendable characteristics, e.g., polymer resins such as polyethersulphone (PES), polyacrylate (PAR), polyetherimide (PEI), polyethylene napthalate (PEN), polyethyleneterephthalate (PET), polyphenylene sulfide (PPS), polyarylate, polyimide (PI), polycarbonate (PC), or cellulose acetate propionate (CAP).

A wire may be arranged on the peripheral area PA at the outer portion of the display area DA of the substrate 100. The wire may be, e.g., an electrode power supply line (EPSL). In FIG. 1, the electrode power supply line EPSL roughly surrounds the display area DA, e.g., may have a U-shape or an inverted U-shape. Accordingly, electric signals from outside may be supplied via two pads at an edge (in a +x direction) of the substrate 100. Here, pads may denote ends of the electrode power supply line EPSL, or the ends of the electrode power supply line EPSL and portions electrically connected to the ends.

Figure 2:
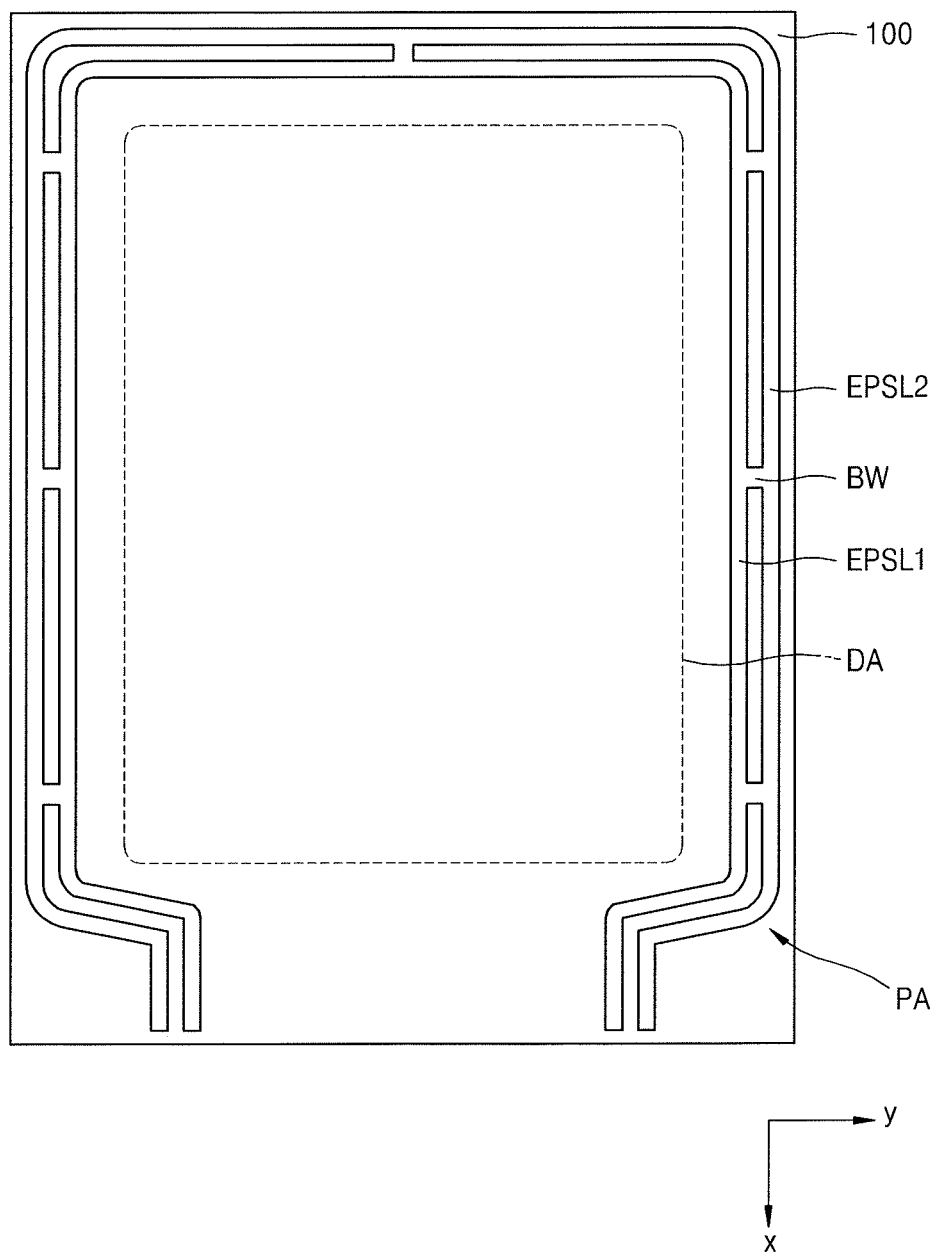
FIG. 2 illustrates a schematic plan view of a part of a display apparatus according to an embodiment.

In an implementation, the number of the electrode power supply line EPSL and a shape of the electrode power supply line EPSL may be variously modified. For example, as shown in FIG. 2 (which is a schematic plan view of a part of a display apparatus according to an embodiment), the electrode power supply line EPSL may include a plurality of wires EPSL1 and EPSL2 that are in parallel with each other, and the plurality of wires EPSL1 and EPSL2 may be electrically connected to each other. In an implementation, the electrode power supply line EPSL may include the plurality of wires EPSL1 and EPSL2 that are in parallel with each other, and branch wires BW for electrically connecting the plurality of wires EPSL1 and EPSL2. Each of the plurality of wires EPSL1 and EPSL2 may have a shape that is similar to that of the electrode power supply line EPSL shown in FIG. 1.

The electrode power supply line EPSL as described above may be located, e.g., within the display area DA, and may be electrically connected to an opposite electrode that is a common electrode extending to outside the display area DA to apply electric signals to the opposite electrode.

Figure 3:
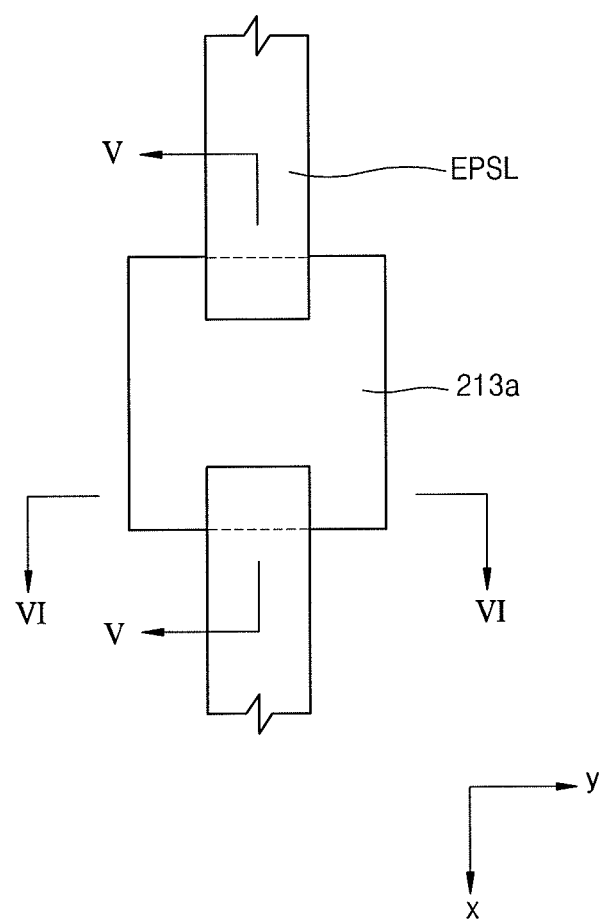
FIG. 3 illustrates a partially enlarged view of a part A in the display apparatus of FIG. 1.

FIG. 3 illustrates a partially enlarged view of a portion A in the display apparatus of FIG. 1, and shows a connecting structure of the electrode power supply line EPSL. As illustrated in FIG. 1, the electrode power supply line EPSL may have an integrated shape without disconnection. As shown in FIG. 3, the electrode power supply line EPSL may be disconnected at a part. In FIG. 3, the electrode power supply line EPSL extending in the +x direction may be disconnected. In an implementation, a first conductive layer 213a (e.g., a connecting conductive layer) may be provided under or adjacent to the electrode power supply line EPSL and the first conductive layer 213a is electrically connected to the electrode power supply line EPSL, and the electric signals may be transferred via the electrode power supply line EPSL even if the electrode power supply line EPSL is disconnected.

Figure 4:
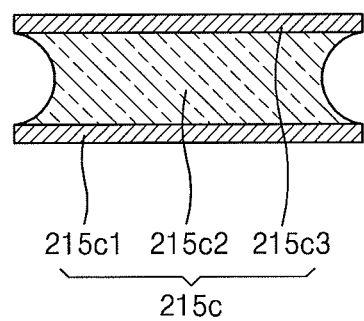
FIG. 4 illustrates a schematic cross-sectional view of a conductive layer in the display apparatus of FIG. 1.

The electrode power supply line EPSL may include a second conductive layer 215c (e.g., a main conductive layer) as will be described below, and the second conductive layer 215c may have a multiple-layered structure as shown in FIG. 4. For example, as shown in FIG. 4, the second conductive layer 215c may include a lower layer 215c1, an intermediate layer 215c2, and an upper layer 215c3. The lower layer 215c1, e.g., a conductive layer, may be formed by using a material, the intermediate layer 215c2, e.g., a conductive layer, may be formed by using a material, and the upper layer 215c3, e.g., a conductive layer, may be formed by using a material. After that, the three conductive layers may be patterned simultaneously to obtain the second conductive layer 215c.

If etch rates of the three conductive layers are not identical with one another during manufacturing the second conductive layer 215c as described above, side surfaces of the second conductive layer 215c may not be consistent. For example, the lower layer 215c1 and the upper layer 215c3 may include titanium, and the intermediate layer 215c2 may include aluminum. In this case, a wet etch rate of the aluminum may be greater than that of the titanium, and the side surfaces of the intermediate layer 215c2 may be concave after finishing the patterning process as shown in FIG. 4. Thus, the second conductive layer 215c may have the side surfaces having concave center portions, and as will be described below, a crack may occur in an encapsulation layer 400 around the side surfaces of the second conductive layer 215c when forming the encapsulation layer 400 covering the second conductive layer 215c.

As described above with reference to FIG. 1, the electrode power supply line EPSL may have the U-shape or the inverted U-shape, and the electric signals from the outside may be applied via the two pads at the edge of the substrate (in the +x direction). Here, the pads may denote end portions of the electrode power supply line EPSL, or portions including the end portions and parts electrically connected to the end portions.

If the electrode power supply line EPSL were to be continuously connected to the pads without disconnection, the pads may also have the structure that is the same as that of the electrode power supply line EPSL. Therefore, a crack could occur in the pads or the encapsulation layer 400 around the pads. Thus, impurities such as external moisture or oxygen could infiltrate into the display panel via the crack and cause defects in the display devices of the display area DA, which are adjacent to the crack.

The crack could also occur in the encapsulation layer 400 adjacent to the other parts of the electrode power supply line EPSL and may affect the display devices nearby. However, the pads or portions adjacent to the pads in the electrode power supply line EPSL may be at the edge of the substrate 100 (in the +x direction) as shown in FIG. 1, and thus, if the crack were to occur in the encapsulation layer 400 around the pads or the adjacent portions, it could be much easier for the impurities such as the external moisture or oxygen to infiltrate into the display panel and directly and largely affect the corresponding portions of the display area DA. The impurities infiltrated into through the crack that has occurred around the pads or the adjacent portions may infiltrate into the display panel along the electrode power supply line EPSL.

In the display apparatus according to the embodiment, the electrode power supply line EPSL (including the second conductive layer 215c) may be disconnected as shown in FIG. 3. Therefore, the crack may not occur in the encapsulation layer 400 at the portion where the electrode power supply line EPSL is disconnected. Then, even if the impurities were to infiltrate through a crack in the encapsulation layer 400 around the pads or the adjacent portions, the impurities may not further infiltrate along the electrode power supply line EPSL at the disconnected portion of the electrode power supply line EPSL. Also, there may be no crack in the encapsulation layer 400 at the disconnected portion of the electrode power supply line EPSL, and the impurities may not infiltrate into the display area DA. As such, defects that could otherwise occur in the display apparatus may be effectively prevented during manufacturing the display apparatus and utilizing the display apparatus.

Hereinafter, structures of the first conductive layer 213a and the electrode power supply line EPSL will be described in more detail below.

Figure 5:
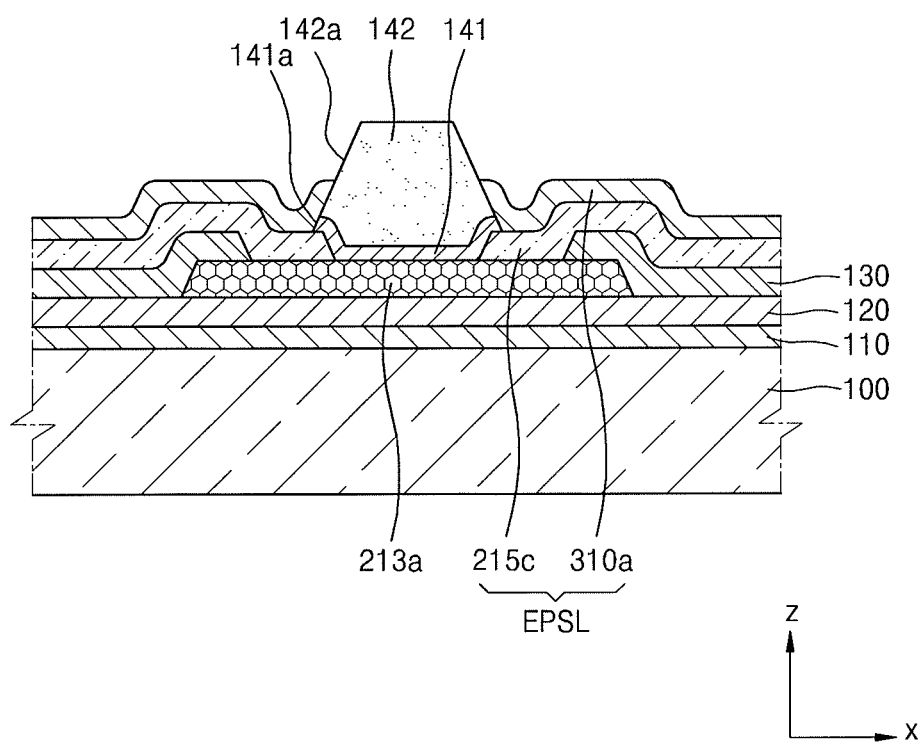
FIG. 5 illustrates a schematic cross-sectional view of the display apparatus taken along a line V-V of FIG. 3.
Figure 6:
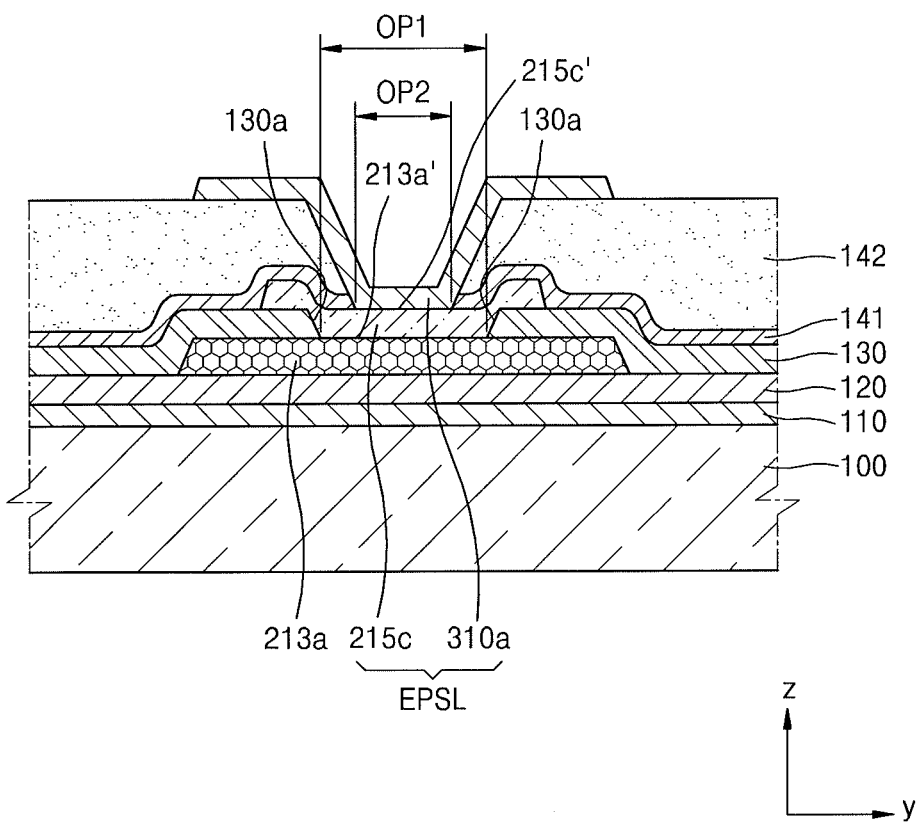
FIG. 6 illustrates a schematic cross-sectional view of the display apparatus taken along a line VI-VI of FIG. 3.

FIG. 5 illustrates a schematic cross-sectional view of the display apparatus taken along a line V-V of FIG. 3. FIG. 6 illustrates a schematic cross-sectional view of the display apparatus taken along a line VI-VI of FIG. 3.

As shown in FIGS. 5 and 6, the first conductive layer 213a may be located on the substrate 100. For example, the first conductive layer 213a may be arranged on a buffer layer 110 and a gate insulating layer 120 on the substrate 100, e.g., such that the buffer layer 110 and the gate insulating layer 120 are between the first conductive layer 213a and the substrate 100. The first conductive layer 213a may have, e.g., a single-layered structure or a multi-layered structure. In latter case, the first conductive layer 213a may include, e.g., a layer including molybdenum and a layer including tungsten. In an implementation, the first conductive layer 213a may have three or more layers.

Figure 7:
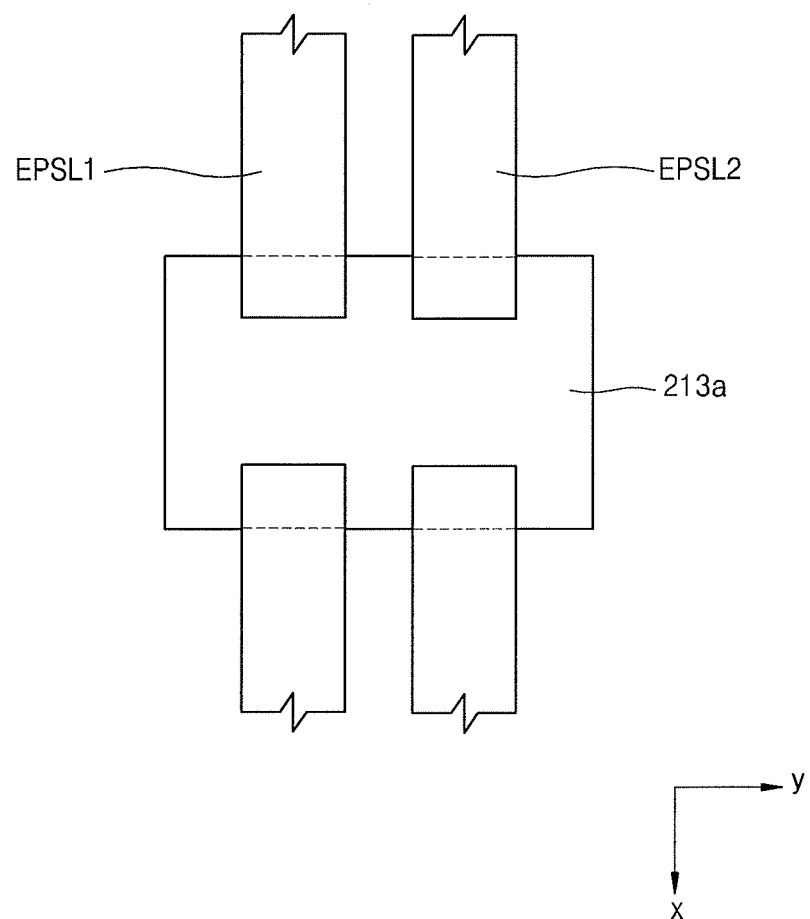
FIG. 7 illustrates a schematic plan view of a part of a display apparatus according to an embodiment.

The first conductive layer 213a may be formed as an island in plan view (e.g., on an xy plane) as shown in FIG. 3. As described above with reference to FIG. 2, when the electrode power supply line EPSL includes the plurality of wires EPSL1 and EPSL2, each of the plurality of wires EPSL1 and EPSL2 may be disconnected as shown in FIG. 7 (which illustrates a schematic plan view of a part of a display apparatus according to an embodiment). In an implementation, the first conductive layer 213a may be located under the plurality of wires EPSL1 and EPSL2 to be electrically connected to the plurality of wires EPSL1 and EPSL2, and accordingly, the electric signals may be transferred via the plurality of wires EPSL1 and EPSL2 even if the plurality of wires EPSL1 and EPSL2 are disconnected. In an implementation, one first conductive layer 213a may contact all of the plurality of wires EPSL1 and EPSL2. In this case, the first conductive layer 213a may be formed as an island on a plan view like FIG. 7 (on the xy plane).

The first conductive layer 213a may be partially covered by an interlayer insulating layer 130, e.g., a first insulating layer. For example, the interlayer insulating layer 130 may partially cover the first conductive layer 213a and may have a first opening OP1. The first opening OP1 may expose or overlie a first upper surface 213a' (e.g., connection side) including at least a center portion of an upper surface of the first conductive layer 213a (in the +z direction). Accordingly, the interlayer insulating layer 130 may partially cover an edge of the upper surface of the first conductive layer 213a. In an implementation, the first upper surface 213a' (that is a part of the upper surface of the first conductive layer 213a) may be understood as a portion that is not covered by the interlayer insulating layer 130 in the upper surface of the first conductive layer 213a.

The second conductive layer 215c (of the electrode power supply line EPSL) may be located at least partially on the first upper surface 213a' of the first conductive layer 213a and the interlayer insulating layer 130, e.g., the first insulating layer. In an implementation, a part of the second conductive layer 215c may be covered by a protective layer 141, e.g., a second insulating layer. For example, the protective layer 141 may partially cover the second conductive layer 215c and may include a second opening OP2 that exposes a second upper surface 215c' (e.g., an outwardly facing surface, and including at least a center portion of the upper surface of the second conductive layer 215c (in a +z direction)). Accordingly, the protective layer 141 may cover at least a part of an upper edge of the second conductive layer 215c. In an implementation, the second upper surface 215c' (that is a part of the upper surface of the second conductive layer 215c) may be understood as a part of the upper surface of the second conductive layer 215c, which is not covered by the protective layer 141. For example, an area of the second opening OP2 of the protective layer 141 may be less than that of a first opening OP1 of the interlayer insulating layer 130.

The protective layer 141 may include the second opening OP2 in order to electrically connect a third conductive layer 310a (that may be further included in the electrode power supply line EPSL) to the second conductive layer 215c, as will be described below. Forming of the second opening OP2 in the protective layer 141 may be performed by various suitable methods, e.g., a dry etching method.

As described above, the second conductive layer 215c may be located on at least a part of the first upper surface 213a' in the first conductive layer 213a and the interlayer insulating layer 130, e.g., the first insulating layer, and the second conductive layer 215c may cover an inner side surface 130a of the first opening OP1. In an implementation, due to a step around the inner side surface 130a of the interlayer insulating layer 130, a thickness of the second conductive layer 215c around the inner side surface 130a of the first opening OP1 may be less than that of the second conductive layer 215c of any other part.

When the second opening OP2 is formed by the drying etching method, a lower layer of the protective layer 141 where the second opening OP2 is to be formed could be partially damaged. If the second opening OP2 were to have a greater area than that of the first opening OP1 and formed by the dry etching method, the second conductive layer 215c around the inner side surface 130a of the first opening OP1 in the interlayer insulating layer 130 could be affected by the dry etching. The thickness of the second conductive layer 215c at the portion corresponding to the inner side surface 130a may be less than that of other parts of the second conductive layer 215c, and the second conductive layer 215c could be disconnected when the second opening OP2 is formed in the protective layer 141.

However, according to the display apparatus of the embodiment, the second opening OP2 of the protective layer 141 may have an area that is less than that of the first opening OP1 in the interlayer insulating layer 130. Therefore, even if the second conductive layer 215c (that is under the protective layer 141 in which the second opening OP2 is to be formed) were to be partially damaged when the second opening OP2 is formed by the dry etching method, the portion of the second conductive layer 215c around the inner side surface 130a of the first opening OP1 of the interlayer insulating layer 130 may not be damaged or may be less damaged. This is because the protective layer 141 above or on the portion of the second conductive layer 215c around the inner side surface 130a may not be removed, as shown in FIG. 6. Therefore, according to the display apparatus of the embodiment, defects such as a disconnection in the second conductive layer 215c may be reduced and/or effectively prevented.

As described above, due to the step around the inner side surface 130a of the interlayer insulating layer 130, the thickness of the second conductive layer 215c around the inner side surface 130a of the first opening OP1 in the interlayer insulating layer 130 may be less than that of the other parts in the second conductive layer 215c. As described above, a portion of the second conductive layer 215c, which is small in thickness, may be a portion having a step disposed thereunder. In this case, the upper surface of the second conductive layer 215c corresponding to the step may also have a curved surface corresponding to a shape of the step. Therefore, in order to help reduce and/or prevent defects (such as the disconnection in the second conductive layer 215c), the curved surface in the upper surface of the second conductive layer 215c may not be exposed by the second opening OP2 of the protective layer 141. For example, the protective layer 141 may entirely cover the curved surface in the upper surface of the second conductive layer 215c (in the +z direction).

As described above, the portion that is small in thickness in the second conductive layer 215c may have the step thereunder. In this case, the upper surface of the second conductive layer 215c corresponding to the step may also have a curved surface corresponding to the shape of the step. For example, if the center portion of the upper surface in the second conductive layer 215c has a flat surface, the thickness of the second conductive layer 215c at the flat surface may be understood to be constant.

The portion of the second conductive layer 215c having the constant thickness may have a sufficient thickness that is set in advance, unlike the portion of the second conductive layer 215c around the inner side surface 130a of the first opening OP1 in the interlayer insulating layer 130. Therefore, when the center portion of the upper surface in the second conductive layer 215c has the flat surface, the second conductive layer 215c may not be disconnected even if the flat surface were to be partially damaged due to the dry etching process performed on the protective layer 141. Thus, when the protective layer 141, in which the second opening OP2 is formed, covers the second conductive layer 215c (except at least a part of the flat surface in the upper surface of the second conductive layer 215c), disconnection of the second conductive layer 215c may be effectively prevented while sufficiently exposing the second conductive layer 215c.

In an implementation, as shown in FIGS. 5 and 6, the display apparatus according to the embodiment may further include the third conductive layer 310a. The third conductive layer 310a may be an element of the electrode power supply line EPSL, together with the second conductive layer 215c. The third conductive layer 310a may be located on a second upper surface 215c' that is not covered by the protective layer 141 in the upper surface of the second conductive layer 215c, and may be on or over the protective layer 141, e.g., a second insulating layer. The third conductive layer 310a may be located on the second upper surface 215c' that is not covered by the protective layer 141 in the upper surface of the second conductive layer 215c, and the third conductive layer 310a may be electrically connected to the second conductive layer 215c. The third conductive layer 310a may help reduce the exposure of the upper surface of the second conductive layer 215c to outside during manufacturing processes of the display apparatus, so as to help prevent oxidation of the second conductive layer 215c. The third conductive layer 310a may include a conductive oxide material, e.g., indium tin oxide (ITO) or indium zinc oxide (IZO).

In an implementation, as described above, the second opening OP2 of the protective layer 141 may have the area that is smaller than that of the first opening OP1 of the interlayer insulating layer 130. Thus, the flat portion of the upper surface of the second conductive layer 215c may be exposed through the second opening OP2 of the protective layer 141. Accordingly, an interface on which the second conductive layer 215c and the third conductive layer 310 contact each other may be a flat surface that is roughly in parallel with the upper surface of the substrate 100. Thus, contact between the second conductive layer 215c and the third conductive layer 310a may be ensured.

Figure 8:
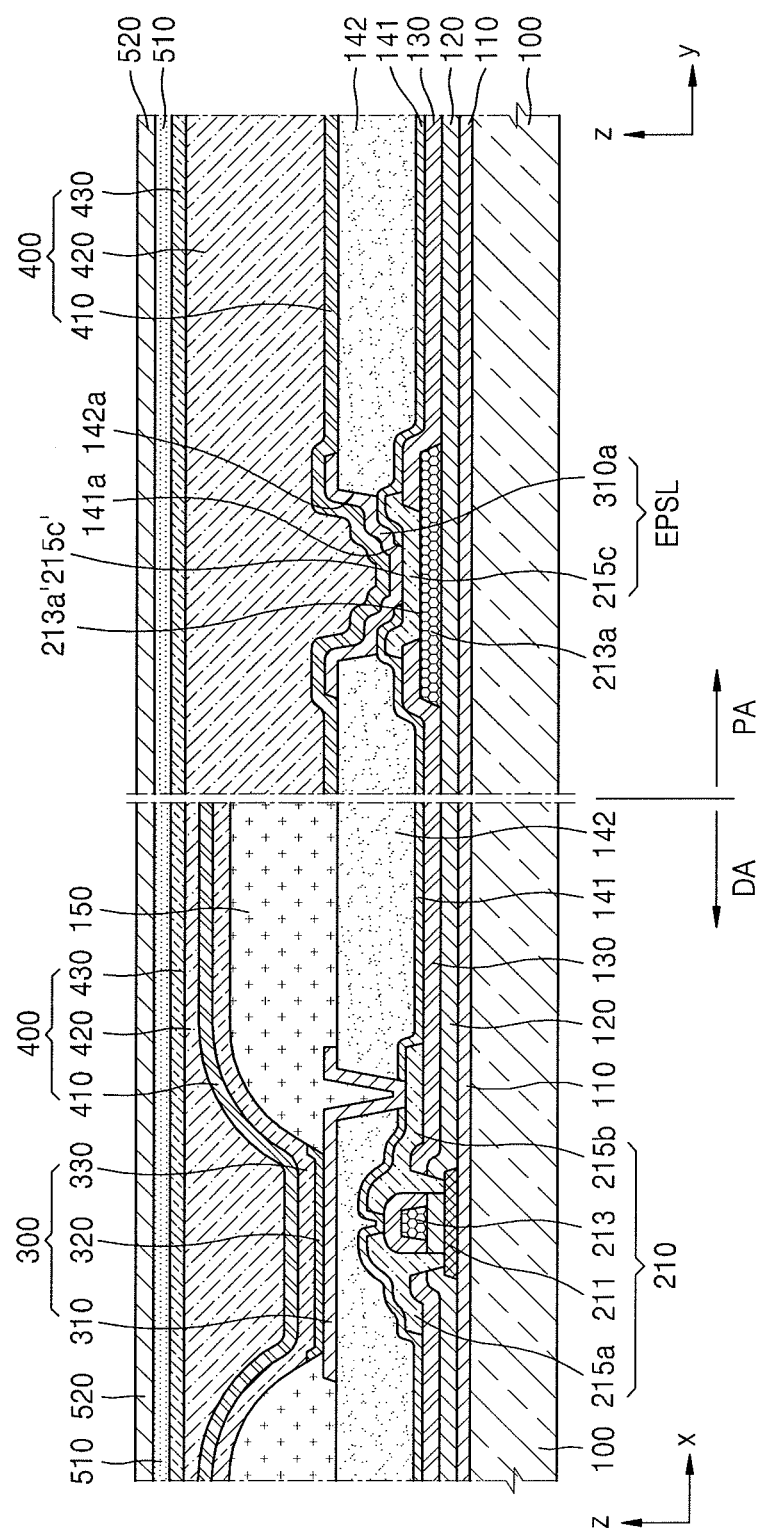
FIG. 8 illustrates a schematic cross-sectional view of the display apparatus taken along a line VIII-VIII of FIG. 1.

FIG. 8 illustrates a schematic cross-sectional view of the display apparatus taken along a line VIII-VIII of FIG. 1, and shows an organic light-emitting device 300 that is a display device in the display area DA, a thin film transistor 210, and the electrode power supply line EPSL. The organic light-emitting device 300 may be electrically connected to the thin film transistor 210, e.g., a pixel electrode 310 of the organic light-emitting device 300 may be electrically connected to one of a source electrode 215a and a drain electrode 215b of the thin film transistor 210. In an implementation, a thin film transistor may be also arranged in the peripheral area PA on the outer portion of the display area DA. The thin film transistor located in the peripheral area PA may be a part of a circuit unit for controlling electric signals applied into the display area DA.

The thin film transistor 210 may include a semiconductor layer 211 including amorphous silicon, polycrystalline silicon, or an organic semiconductor material, a gate electrode 213, the source electrode 215a, and the drain electrode 215b. A gate insulating layer 120 including an inorganic material such as silicon oxide, silicon nitride, and/or silicon oxynitride may be disposed between the semiconductor layer 211 and the gate electrode 213, in order to help ensure an insulating property between the semiconductor layer 211 and the gate electrode 213.

In addition, the interlayer insulating layer 130 including an inorganic material such as silicon oxide, silicon nitride, and/or silicon oxynitride may be arranged on the gate electrode 213, and the source electrode 215a and the drain electrode 215b may be arranged on the interlayer insulating layer 130. As described above, an insulating layer including the inorganic material may be formed by a chemical vapor deposition (CVD) or an atomic layer deposition (ALD) method. In an implementation, the interlayer insulating layer 130 may be identical with the interlayer insulating layer 130, e.g., the first insulating layer, covering at least a part of the edge of the first conductive layer 213a. For example, the interlayer insulating layer 130, that is, the first insulating layer, may include the same material as that of the interlayer insulating layer 130 that is disposed between the source and drain electrodes 215a and 215b and the gate electrode 213.

As described above, the buffer layer 110 may be disposed between the thin film transistor 210 and the substrate 110 having the above structure. The buffer layer 110 may include an inorganic material such as silicon oxide, silicon nitride, and/or silicon oxynitride. The buffer layer 110 may help improve smoothness of the upper surface of the substrate 100, and/or may help prevent or reduce infiltration of impurities from the substrate 100 into the semiconductor layer 211 of the thin film transistor 210.

In an implementation, the protective layer 141 and a planarization layer 142 may be arranged above the thin film transistor 210. The protective layer 141 may help protect the thin film transistor 210 against impurities during the manufacturing processes of the display apparatus, and may include an inorganic material such as silicon oxide, silicon nitride, or silicon oxynitride, or an organic insulating material.

The protective layer 141 may be identical with the protective layer 141, e.g., the second insulating layer, covering at least a part of the edge of the second conductive layer 215c. For example, the protective layer 141, that is, the second insulating layer, may include the same material as that of the protective layer 141 covering the thin film transistor 210. For example, during the manufacturing processes of the display apparatus, the protective layer 141, that is, the second insulating layer, may be formed simultaneously with the protective layer 141 covering the thin film transistor 210 by using the same material.

The planarization layer 142 may help planarize an upper portion of the protective layer 141 covering the thin film transistor 210. The planarization layer 142 may include an organic material, e.g., acryl, bezocyclobutene (BCB), and hexamethyldisiloxane (HMDSO). In an implementation, as illustrated in FIG. 8, the planarization layer 142 has a single-layered structure. In an implementation, the planarization layer 142 may have a multi-layered structure. In addition, as shown in FIG. 8, the planarization layer 142 may have an opening at an outer portion of the display area DA so that a part of the planarization layer 142 in the display area DA and a part of the planarization layer 142 on the outer portion of the substrate 100 may be physically separate from each other. Then, impurities from outside may not reach the display area DA via the planarization layer 142.

In the display area DA, the organic light-emitting device 300 including the pixel electrode 310, an opposite electrode 330, and an intermediate layer 320 including an emission layer and disposed between the pixel electrode 310 and the opposite electrode 330 may be located on the planarization layer 142. The pixel electrode 310 may be electrically connected to the thin film transistor 210 by contacting one of the source electrode 215a and the drain electrode 215b via an opening formed in the planarization layer 142 as shown in FIG. 8.

A pixel defining layer 150 may be on the planarization layer 142. The pixel defining layer 150 may include openings corresponding respectively to sub-pixels, e.g., at least an opening exposing a center portion of the pixel electrode 310, to define pixels. Also, in the example shown in FIG. 8, the pixel defining layer 150 may increase a distance between an edge of the pixel electrode 310 and the opposite electrode 330 above the pixel electrode 310 so as to help prevent an arc from generating at the edge of the pixel electrode 310. The pixel defining layer 150 may include an organic material, e.g., polyimide or hexamethyldisiloxane (HMDSO).

The intermediate layer 320 of the organic light-emitting device 300 may include low-molecular weight organic materials or polymer organic materials. When the intermediate layer 320 includes a low-molecular weight organic material, the intermediate layer may include a hole injection layer (HIL), a hole transport layer (HTL), an emission layer (EML), an electron transport layer (ETL), and an electron injection layer (EIL) in a single or multiple-layered structure. Examples of organic materials may include copper phthalocyanine (CuPc), N,N-Di(naphthalene-1-yl)-N,N'-diphenyl-benzidine (NPB), and tris-8-hydroxyquinoline aluminum ($Alq_3$). The low-molecular weight organic materials may be deposited by a vacuum deposition method.

When the intermediate layer 320 includes a polymer material, the intermediate layer 320 may include a hole transport layer (HTL) and an emission layer (EML). In an implementation, the HTL may include PEDOT, and the EML may include a poly-phenylenevinylene (PPV)-based or polyfluorene-based polymer material. The intermediate layer 320 above may be formed by a screen printing method, an inkjet printing method, or a laser induced thermal imaging (LITI) method.

In an implementation, the intermediate layer 320 may include a layer that is integrally formed throughout a plurality of pixel electrodes 310, or a layer that is patterned to correspond to each of the plurality of pixel electrodes 310.

The opposite electrode 330 may be arranged above or on the display area DA, and as shown in FIG. 8, may cover the display area DA. For example, the opposite electrode 330 may be integrally formed with respect to a plurality of organic light-emitting devices, so as to correspond to a plurality of pixel electrodes 310. The opposite electrode 330 may extend to at least a part of the peripheral area PA on the outer portion of the display area DA so as to be electrically connected to the electrode power supply line EPSL, as will be described below.

The organic light-emitting device could be easily damaged by the external moisture or oxygen. Thus, the encapsulation layer 400 may cover the organic light-emitting device to protect the organic light-emitting device. The encapsulation layer 400 may cover the display area DA, and may extend to outside the display area DA. In an implementation, the encapsulation layer 400 may include a first inorganic encapsulation layer 410, an organic encapsulation layer 420, and a second inorganic encapsulation layer 430 as shown in FIG. 8.

The first inorganic encapsulation layer 410 may cover the opposite electrode 330, and may include silicon oxide, silicon nitride, and/or silicon oxynitride. In an implementation, other layers such as a capping layer may be disposed between the first inorganic encapsulation layer 410 and the opposite electrode 330. The first inorganic encapsulation layer 410 may be formed along with a structure disposed thereunder, and may have an upper surface that is not flat as shown in FIG. 8. The organic encapsulation layer 420 may cover the first inorganic encapsulation layer 410, and may have an even upper surface, unlike the first inorganic encapsulation layer 410. For example, the organic encapsulation layer 420 may have the even upper surface corresponding to the display area DA. The organic encapsulation layer 420 may include one or more of polyethylene terephthalate, polyethylene naphthalate, polycarbonate, polyimide, polyethylene sulfonate, polyoxymethylene, polyarylate, or hexamethyldisiloxane. The second inorganic encapsulation layer 430 may cover the organic encapsulation layer 420, and may include silicon oxide, silicon nitride, and/or silicon oxynitride. The second inorganic encapsulation layer 430 may contact the first inorganic encapsulation layer 410 by an edge thereof at an outer portion of the display area DA, in order not to expose the organic encapsulation layer 420 to the outside.

As described above, the encapsulation layer 400 may include the first inorganic encapsulation layer 410, the organic encapsulation layer 420, and the second inorganic encapsulation layer 430, and even if there is a crack in the encapsulation layer 400 in the above multi-layered structure, the crack may be disconnected between the first inorganic encapsulation layer 410 and the organic encapsulation layer 420 or between the organic encapsulation layer 420 and the second inorganic encapsulation layer 430. As such, forming of a path through which external moisture or oxygen may infiltrate into the display area DA may be prevented or reduced.

If desired, processes of forming a touch electrode of various patterns for implementing a touch screen function or forming a touch protective layer for protecting the touch electrode on the encapsulation layer 400 may be further performed. The touch electrode or the touch protective layer may be formed on the encapsulation layer 400 through processes such as deposition. Otherwise, a touch panel prepared in advance to include the touch electrode may be attached to the encapsulation layer 400 so that the display apparatus may have a touch screen function.

A polarization plate 520 may be attached on the encapsulation layer 400 via an optically clear adhesive (OCA) 510. The polarization plate 520 may reduce reflection of external light. For example, when the external light that passed through the polarization plate 520 is reflected by an upper surface of the opposite electrode 330 and then passes through the polarization plate 520 again, the external light passes through the polarization plate 520 twice and a phase of the external light may be changed. Therefore, a phase of reflected light may be different from the phase of the external light entering the polarization plate 520 and thus destructive interference occurs, and accordingly, the reflection of the external light may be reduced and visibility may be improved. The OCA 510 and the polarization plate 520 may cover an opening in the planarization layer 142 as shown in FIG. 8.

In an implementation, the display apparatus according to the embodiment may not include the polarization plate 520, and if desired, the polarization plate 520 may be omitted or replaced with another component. For example, the polarization plate 520 may be omitted, and instead, a black matrix and a color filter may be provided to reduce the reflection of external light in the display apparatus.

In the display apparatus according to the embodiment, the first conductive layer 213a located where the electrode power supply line EPSL is disconnected may include a material that is the same as that of the gate electrode 213 of the thin film transistor 210. For example, the first conductive layer 213a may include the same material as that of the gate electrode 213 of the thin film transistor 210 and may be formed simultaneously with the gate electrode 213. The first conductive layer 213a may include, e.g., molybdenum.

In an implementation, the second conductive layer 215c included in the electrode power supply line EPSL may include the same material as that of the source electrode 215a and the drain electrode 215b in the thin film transistor 210. For example, the second conductive layer 215c may be formed simultaneously with the source and drain electrodes 215a and 215b in the thin film transistor 210, by using the same material as those of the source and drain electrodes 215a and 215b. Likewise, the third conductive layer 310a included in the electrode power supply line EPSL may include the same material as that of the pixel electrode 310 of the organic light-emitting device 300 in the display area DA. For example, the third conductive layer 310a may be formed simultaneously with the pixel electrode 310 of the organic light-emitting device 300 in the display area DA, by using the same material as that of the pixel electrode 310. The second conductive layer 215c may include a titanium layer, an aluminum layer, and/or an additional titanium layer as described above, and the third conductive layer 310a may include a conductive oxide material such as ITO and IZO as described above.

In an implementation, a touch electrode of various patterns for implementing the touch screen function may be located on the encapsulation layer 400. When forming the touch electrode, the third conductive layer 310*a* may be formed at the same time by using the same material as that of the touch electrode. The above configuration of forming the third conductive layer 310*a* simultaneously with the forming of the touch electrode may be applied to display apparatuses described above or will be described later.

Figure 9:
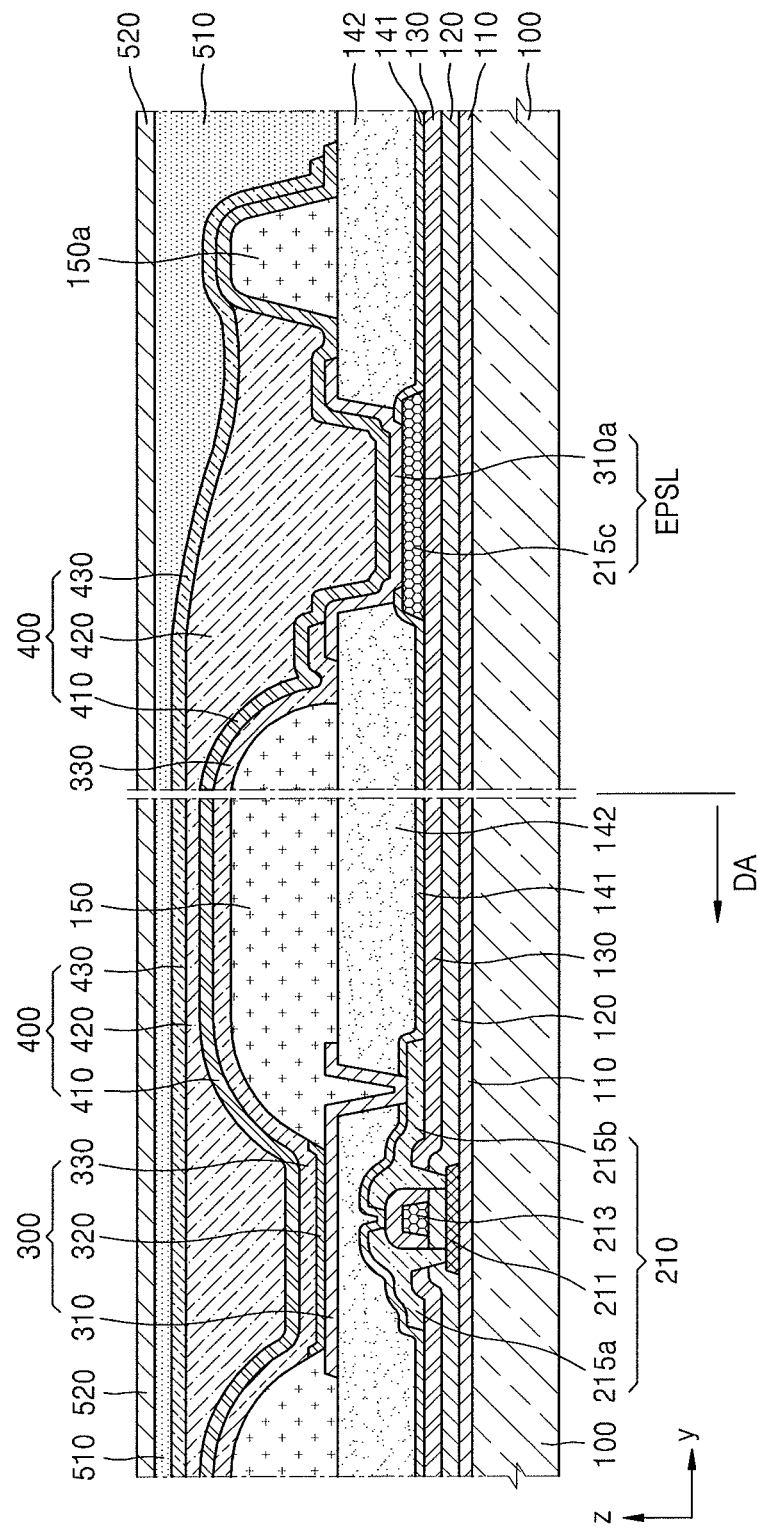
FIG. 9 illustrates a schematic cross-sectional view of the display apparatus taken along a line IX-IX of FIG. 1.

The electrode power supply line EPSL may be electrically connected to the opposite electrode 330 so as to apply electric signals to the opposite electrode 330. The electric connection structure between the electrode power supply line EPSL and the opposite electrode 330 is shown in FIG. 9 that is a schematic cross-sectional view of the display apparatus taken along a line IX-IX of FIG. 1. As shown in FIG. 9, the opposite electrode 330 extends to the peripheral area PA on the outer portion of the display area DA, so as to contact the third conductive layer 310*a* that is included in the electrode power supply line EPSL. As such, electric signals may be applied to the opposite electrode 330. If the electrode power supply line EPSL does not include the third conductive layer 310*a* but only includes the second conductive layer 215*c*, the opposite electrode 330 may contact the second conductive layer 215*c*.

As shown in FIG. 9, a dam 150*a* may be located at an edge of the peripheral area PA of the substrate 100. The dam 150*a* may include the same material as that of the pixel defining layer 150 in the display area DA. For example, the dam 150*a* may be formed simultaneously with the pixel defining layer 150 by using the same material as the pixel defining layer 150. The dam 150*a* may help prevent a material for forming the organic encapsulation layer 420 from overflowing to the edge of the substrate 100 when the encapsulation layer 400 is formed. In this case, the first inorganic encapsulation layer 410 and the second inorganic encapsulation layer 430 may contact each other at an outer portion of the organic encapsulation layer 420, and moreover, the first inorganic encapsulation layer 410 and the second inorganic encapsulation layer 430 may extend near the edge of the substrate 100 beyond the dam 150*a*.

In an implementation, when the thin film transistor 210 is formed as shown in FIG. 8, contact holes need to be formed in the gate insulating layer 120 and the interlayer insulating layer 130 in order for the source and drain electrodes 215*a* and 215*b* to contact the semiconductor layer 211. The first opening OP1 (see FIG. 6) in the interlayer insulating layer 130, e.g., the first insulating layer, may be formed at the same time when the contact holes in the thin film transistor are formed.

In an implementation, in order for the pixel electrode 310 to contact the source electrode 215*a* or the drain electrode 215*b* of the thin film transistor 210 in the display area DA, via holes need to be formed in the protective layer 141 and the planarization layer 142. The second opening OP2 (see FIG. 6) of the protective layer 141, e.g., the second insulating layer, may be formed at the same time when the via holes are formed. For example, if associated parts of the planarization layer 142 are removed when the second opening OP2 is formed in the protective layer 141, an inner surface of the second opening OP2 in the protective layer and an inner surface of the opening in the planarization layer 142 may be identical with each other.

If an etch rate of the material for forming the planarization layer 142 is greater than that of the material for forming the protective layer 141, an inner surface 141*a* of the second opening OP2 in the protective layer 141 and an inner surface 142*a* of the opening in the planarization layer 142 may not be identical with each other as shown in FIG. 8. For example, the inner surface 142*a* of the opening in the planarization layer 142 may be located on the upper surface of the protective layer 141. The structure shown in FIG. 8 may be also obtained when the opening is formed in the planarization layer 142 in a separate process after forming the second opening OP2 in the protective layer 141.

In an implementation, the display apparatus may include both the protective layer 141 and the planarization layer 142. In an implementation, the display apparatus may only include the protective layer 141, without including the planarization layer 142. In an implementation, the display apparatus may only include the planarization layer 142, without including the protective layer 141. In latter case, the above descriptions about the protective layer 141 in the above-described embodiments and modified examples thereof may be applied to the planarization layer 142.

By way of summation and review, in some display apparatuses, defective pixels could occur in the display area at a portion adjacent to terminals of the wires on the periphery during manufacturing of the display apparatus, or defective pixels could occur at the portion adjacent to the terminals of the wires on the periphery while moving the display apparatus.

According to the one or more embodiments, the display apparatus capable of reducing a possibility of generating defects during manufacturing processes or utilization processes thereof may be implemented.

The embodiments may provide a display apparatus capable of reducing a possibility of defects when the display apparatus is manufactured or used.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
    a substrate that includes a display area and a peripheral area, the peripheral area being outside of the display area;
    a first conductive layer in the peripheral area;
    a first insulating layer that includes a first opening exposing a first upper surface of the first conductive layer and covering at least a part of an upper edge of the first conductive layer, wherein the first upper surface of the first conductive layer includes at least a center portion of an upper surface of the first conductive layer;
    a second conductive layer on at least a part of the first upper surface of the first conductive layer and on the first insulating layer; and
    a second insulating layer that includes a second opening exposing a second upper surface of the second conductive layer and covering at least a part of an upper edge of the second conductive layer, wherein the second upper surface of the second conductive layer includes at least a center portion of an upper surface of the second conductive layer and the second opening has a width that is less than a width of the first opening in a cross section perpendicular to an extension direction of the second conductive layer.

2. The display apparatus as claimed in claim 1, wherein:
the upper surface of the second conductive layer includes a flat portion at the center portion thereof, and
the second insulating layer covers the upper surface of the second conductive layer except at least a part of the flat portion.

3. The display apparatus as claimed in claim 1, wherein:
the upper surface of the second conductive layer has a curved surface in a part thereof, and
the second insulating layer covers the curved surface in the upper surface of the second conductive layer.

4. The display apparatus as claimed in claim 1, further comprising
a thin film transistor in the display area, the thin film transistor including a gate electrode, a source electrode, and a drain electrode, and wherein:
the first conductive layer includes a material that is the same as a material of the gate electrode, and
the second conductive layer includes a material that is the same as a material of the source electrode and the drain electrode.

5. The display apparatus as claimed in claim 4, wherein:
the first insulating layer includes a material that is the same as a material of an interlayer insulating layer that is between the source and drain electrodes and the gate electrode, and
the second insulating layer includes a material that is the same as a material of a protective layer covering the source electrode and the drain electrode.

6. The display apparatus as claimed in claim 5, wherein:
the first insulating layer is integral with the interlayer insulating layer, and
the second insulating layer is integral with the protective layer.

7. The display apparatus as claimed in claim 1, further comprising
a third conductive layer on the second upper surface of the second conductive layer and the second insulating layer.

8. The display apparatus as claimed in claim 7, further comprising:
a thin film transistor in the display area, the thin film transistor including a gate electrode, a source electrode, and a drain electrode; and
a pixel electrode electrically connected to one of the source electrode and the drain electrode, wherein:
the first conductive layer includes a material that is the same as a material of the gate electrode,
the second conductive layer includes a material that is the same as a material of the source electrode and the drain electrode, and
the third conductive layer includes a material that is the same as a material of the pixel electrode.

9. The display apparatus as claimed in claim 8, wherein:
the first insulating layer includes a material that is the same as a material of an interlayer insulating layer between the source and drain electrodes and the gate electrode, and
the second insulating layer includes a material that is the same as a material of a protective layer covering the source electrode and the drain electrode.

10. The display apparatus as claimed in claim 9, wherein:
the first insulating layer is integral with the interlayer insulating layer, and
the second insulating layer is integral with the protective layer.

11. The display apparatus as claimed in claim 7, further comprising
an opposite electrode that is provided integrally throughout the display area and extending to a part of the peripheral area, wherein the opposite electrode electrically contacts the third conductive layer.

12. The display apparatus as claimed in claim 1, further comprising
an opposite electrode that is provided integrally throughout the display area and extending to a part of the peripheral area, wherein the opposite electrode is electrically connected to the second conductive layer.

13. The display apparatus as claimed in claim 1, wherein the first conductive layer has an island shape.

14. The display apparatus as claimed in claim 1, wherein the second conductive layer is connected to a pad and includes a discontinuity overlapping with the first opening.

15. A display apparatus, comprising:
a substrate that includes a display area and a peripheral area, the display area including pixels and the peripheral area being outside of the display area; and
an electrode power supply line electrically connected to the pixels of the display area, wherein the electrode power supply line includes:
a connecting conductive layer, and
a main conductive layer connected by the connecting conductive layer,
wherein the connecting conductive layer has a connection side that is connected to the main conductive layer and a substrate facing side that is opposite to the connection side and that faces the substrate,
wherein a first insulating layer overlies an outer edge of the connection side of the connecting conductive layer and includes a first opening that is open on a central portion of the connection side of the connecting conductive layer,
wherein the main conductive layer contacts the connection side of the connecting conductive layer at the central portion of the connection side of the connecting conductive layer,
wherein a second insulating layer overlies an outer edge of an outwardly facing surface of the main conductive layer and includes a second opening that is open on a central portion of the outwardly facing surface of the main conductive layer, and wherein the second opening has a width that is smaller than a width of the first opening in a cross section perpendicular to an extension direction of the main conductive layer.

16. The display apparatus as claimed in claim 15, wherein:
the central portion of the outwardly facing surface of the main conductive layer includes a flat portion, and
the second insulating layer covers portions of the outwardly facing surface of the main conductive layer that surround the flat portion.

17. The display apparatus as claimed in claim 15, wherein:
the outwardly facing surface of the main conductive layer has a curved surface in a part thereof, and
the second insulating layer covers the curved surface of the outwardly facing surface of the main conductive layer.

18. The display apparatus as claimed in claim 15, wherein the connecting conductive layer has an island shape.

19. The display apparatus as claimed in claim 15, further comprising
a third conductive layer on the outwardly facing surface of the main conductive layer and the second insulating layer.

20. The display apparatus as claimed in claim 15, wherein the main conductive layer is connected to a pad and includes a discontinuity overlapping with the connecting conductive layer, and wherein the first opening overlaps with the discontinuity.

\* \* \* \* \*